United States Patent [19]
Tischler et al.

[11] Patent Number: 5,679,152
[45] Date of Patent: Oct. 21, 1997

[54] **METHOD OF MAKING A SINGLE CRYSTALS GA*N ARTICLE**

[75] Inventors: Michael A. Tischler, Danbury, Conn.; Thomas F. Kuech, Madison, Wis.

[73] Assignee: Advanced Technology Materials, Inc., Danbury, Conn.

[21] Appl. No.: 188,469

[22] Filed: Jan. 27, 1994

[51] Int. Cl.$^6$ .................................................. C30B 33/08
[52] U.S. Cl. .................... 117/97; 117/1; 117/90; 437/89
[58] Field of Search ................... 117/1, 92, 97, 117/90; 437/89

[56] References Cited

U.S. PATENT DOCUMENTS

| | | | |
|---|---|---|---|
| 4,622,083 | 11/1986 | Shih | 148/175 |
| 4,727,047 | 2/1988 | Bozler et al. | 437/89 |
| 4,931,132 | 6/1990 | Aspnes | 117/84 |

FOREIGN PATENT DOCUMENTS

| | | |
|---|---|---|
| 62-183399 | 6/1987 | Japan. |

OTHER PUBLICATIONS

"Defect reduction in GaAs epitaxial layers using a GaAsP—In Ga As strained layer superlattice" Tischler et al., Appl. Phys. Lett. 46 (3), pp. 294–296 (1985).

"GaN, AlN, and InN: A Review." Strite, S, and Markos, J. Vas. Sci. Technol. B 10 (4), 1237–1266 (1992).

"Current Status of GaN and Related Compounds as Wide-Gap Semiconductors" Matsuoka, T., J. Crystal Growth 124, 433–438 (1992).

*Primary Examiner*—Felisa Garrett
*Attorney, Agent, or Firm*—Janet R. Elliott; Steven J. Hultquist

[57] ABSTRACT

A method of making a single crystal Ga*N article, including the steps of: providing a substrate of crystalline material having a surface which is epitaxially compatible with Ga*N; depositing a layer of single crystal Ga*N over the surface of the substrate; and etchably removing the substrate from the layer of single crystal Ga*N, to yield the layer of single crystal Ga*N as said single crystal Ga*N article. The invention in an article aspect relates to bulk single crystal Ga*N articles, such as are suitable for use as a substrate for the fabrication of microelectronic structures thereon, and to microelectronic devices comprising bulk single crystal Ga*N substrates, and their precursor structures.

18 Claims, 2 Drawing Sheets

1

METHOD OF MAKING A SINGLE CRYSTALS GA*N ARTICLE

BACKGROUND OF THE INVENTION

1. Field of the Invention

This invention relates to bulk single crystal binary, ternary or quaternary gallium nitride (Ga*N), including single crystal Ga*N substrate articles useful for formation of microelectronic structures thereon, as well as to an appertaining method of forming Ga*N in single crystal bulk form.

2. Description of the Related Art

The III-V nitrides, in consequence of their electronic and optical properties and heterostructure character, are highly advantageous in the fabrication of a wide range of microelectronic structures. In addition to their wide band gaps, the III-V nitrides also have direct band gaps and are able to form alloys which permit fabrication of well lattice-matched heterostructures. Consequently, devices made from the III-V nitrides can operate at high temperatures, with high power capabilities, and can efficiently emit light in the blue and ultraviolet regions of the electromagnetic spectrum. Devices fabricated from III-V nitrides have applications in full color displays, super-luminescent light-emitting diodes (LEDs), high density optical storage systems, excitation sources for spectroscopic analysis applications, etc. High temperature applications are found in automotive and aeronautical electronics.

To effectively utilize the aforementioned advantages of the III-V nitrides, however, requires that such materials have device quality and a structure accommodating abrupt heterostructure interfaces, viz., III-V nitrides must be of single crystal character, substantially free of defects that are electrically or optically active.

A particularly advantageous III-V nitride is GaN. This nitride species can be utilized in combination with aluminum nitride (AlN) to provide optically efficient, high temperature, wide band gap heterostructure semiconductor systems having a convenient, closely matched heterostructure character similar to that of GaAs/AlAs. Small amounts of indium nitride may be added to GaN or AlN while maintaining acceptable lattice match.

Corresponding advantages are inherent in ternary GaN compositions of the shorthand formula MGaN, wherein M is a metal compatible with Ga and N in the composition MGaN, and the composition MGaN is stable at standard temperature and pressure (25° C. and 1 atmosphere pressure) conditions. Examples of potential M species include Al and In. Such compounds have compositions described by the formula $M_{1-x}Ga_xN$, where x ranges from 0 to 1. The addition of a third compatible metal provides quaternary alloys of general formula $M_{1-x-y}M'_yGa_xN$, where M and M' are compatible metals, in particular Al and In, and x and y range from 0 to 1. Such quaternary alloys are referred to by shorthand formula AlGaInN.

Alloys of GaN, AlN or InN with silicon carbide (SIC) may be advantageous because they can provide modulated band gaps. Such alloys have in the past been difficult to grow in single crystal form.

For ease of reference in the ensuing disclosure, therefore, the term "Ga*N" is defined as including binary (e.g., GaN), ternary (MGaN), and quaternary (MM'GaN) type gallium nitride type compounds. Examples of these compounds include AlN, InN, AlGaN, InGaN and AlInGaN. Ga*N also encompasses SiC, SiC/AlN alloys, SiC/GaN alloys, SiClnN alloys, and other related compounds such as alloys of SiC with AlGaN. All possible crystal forms are meant to be included in this shorthand term, including all cubic, hexagonal and rhombohedral modifications and all SiC polytypes.

For device applications, therefore, it would be highly advantageous to provide substrates of Ga*N, for epitaxial growth thereon of any of the Ga*N materials, especially GaN, AlGaN, InGaN, or SiC, for the production of heteroepitaxial devices. Unfortunately, however, it heretofore has not been possible to produce GaN in single crystal bulk form, and for all Ga*N materials, growth of high quality bulk single crystals has been fraught with difficulty.

It therefore would be a significant advance in the microelectronics art, and is correspondingly an object of the present invention, to provide Ga*N in bulk single crystal form, suitable for use thereof as a substrate body for the fabrication of microelectronic structures.

It is another object of the present invention to provide an appertaining method for the formation of bulk single crystal Ga*N which is relatively simple and may be readily achieved using conventional crystal growth techniques in an economic manner.

Other objects and advantages of the invention will be more fully apparent from the ensuing disclosure and appended claims.

SUMMARY OF THE INVENTION

In one aspect, the present invention relates to a method of making a single crystal Ga*N article, including the steps of:

providing a substrate of crystalline material having a surface which is epitaxially compatible with Ga*N under the conditions of Ga*N growth;

depositing a layer of single crystal Ga*N over the surface of the substrate; and etchably removing the substrate from the layer of single crystal Ga*N to yield the layer of single crystal Ga*N as said single crystal Ga*N article.

A key point of this invention is that the substrate is etched away in situ, while the substrate/Ga*N structure is at or near the growth temperature.

The substrate of crystalline material may for example include a material such as silicon, silicon carbide, gallium arsenide, sapphire. etc., for which a suitable etchant may be employed to remove the substrate by etching. In the case of silicon and gallium arsenide, for example, HCl gas may be usefully employed. The layer of single crystal Ga*N may be deposited directly on the surface of the crystalline substrate, or alternatively it may be deposited on an uppermost surface of one or more intermediate layers which in turn are deposited on the crystalline substrate. The one or more intermediate layers may serve as a buffer layer to enhance the crystallinity or other characteristics of the Ga*N layer.

In another aspect, the invention utilizes the outdiffusion of specific species from the substrate into the Ga*N layer to provide enhanced properties of the final Ga*N product. An example of this aspect is the growth of Ga*N on a silicon substrate. In this case, Si can be caused to diffuse out of the silicon substrate and into the Ga*N. This diffusion will form a thin Ga*N region which is heavily doped with silicon. Silicon-doped Ga*N is n-type, and this structure is advantageous in certain device structures, as for example for making ohmic contacts to the back surface of the Ga*N layer or for forming p-n junctions.

In another aspect, the invention relates to bulk single crystal Ga*N articles, such as are suitable for use as substrates for the fabrication of microelectronic structures thereon. As used herein, the term "bulk single crystal Ga*N" refers to a body of single polytype crystalline Ga*N having three dimensional (x,y,z) character wherein each of the dimensions x, y is at least 100 micrometers and the direction z is at least 1 μm. In the preferred practice of the invention, the single crystal Ga*N product will be of cylindrical or disc-shaped form, with diameter d and thickness z, where d is at least 100 μm and z is at least 1 μm. In a preferred aspect, each of the dimensions d and z is at least 200 micrometers. The bulk single crystal Ga*N article may most preferably have a thickness dimension z of at least 100 micrometers, and diameter which is at least 2.5 centimeters.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
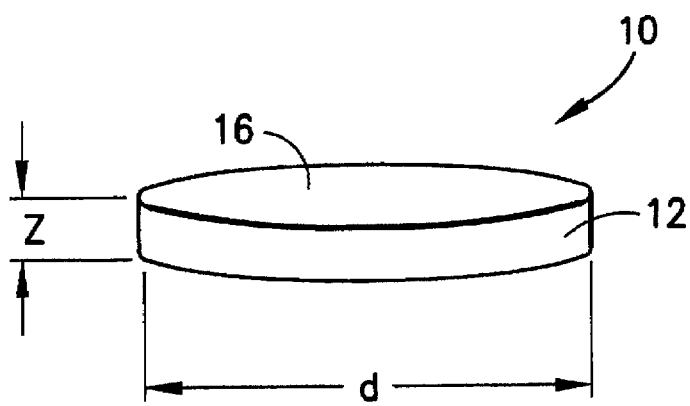
FIG. 1 is a perspective view of a bulk single crystal Ga*N article according to one aspect of the invention.

The present invention is based on the discovery that single crystal Ga*N articles of a self-supporting structural character can be readily formed by the deposition of single crystal Ga*N on a substrate epitaxially compatible with the single crystal Ga*N, followed by in-situ removal of the substrate at the growth temperature. The substrate is removed by etching it away from the single crystal Ga*N, at the Ga*N growth temperature, to yield the single crystal Ga*N as a product article.

Since no Ga*N substrates currently (before the making of the present invention) exist, growth of these compounds must initially take place heteroepitaxially, for example GaN on silicon. Two types of defects arise as a result of heteroepitaxial growth. The first is dislocations due to the lattice mismatch between the Ga*N layer and the substrate. The typical substrate is sapphire, which has a 13.8% lattice mismatch to GaN. SiC is a closer lattice match (≈3%), but the mismatch is still quite large. Many other substrates have been used, but all of them have large lattice mismatches and result in a high density of defects in the grown layers.

The second kind of defect is dislocations generated during cool-down after growth as a result of different thermal coefficients of expansion of the substrate and epitaxial layer. In accordance with the present invention, a method for reducing or eliminating the generation of these defects is employed to produce large area, high quality single crystal Ga*N substrates.

In carrying out the present invention, a sacrificial substrate is employed, upon which is nucleated the Ga*N layer. The Ga*N layer is grown on the substrate to the desired thickness and then the substrate is etched away, in-situ, at temperatures close to the growth temperature. Suitable temperatures for the etching step (close to the growth temperature) are desirably within 100° C., and preferably within 50° C., and most preferably within 25° C. of the temperature at which the Ga*N layer is grown.

Dislocations arising from the lattice mismatch are reduced in density by growing thick Ga*N layers. It is known that the misfit dislocation density decreases with epitaxial layer thickness, and in the practice of the present invention, very thick (25–1000 μm) layers can be grown. In fact, if the sacrificial substrate is more easily deformable than Ga*N and is very thin (extremely thin silicon substrates are commercially available in thicknesses as thin as 2–5 μm), growth of a thick overlayer of Ga*N may have the effect of pushing the defects into the sacrificial substrate, leaving a substantially defect-free Ga*N single crystal product after the etching step. The misfit dislocation density can be further reduced by using buffer layers which may be a single compound, a compositionally graded layer structure, or a superlattice structure comprising alternating layers A and B, where A and B are selected from GaN, AlN and InN and alloys of SiC with these nitrides. In general, the strained superlattice can comprise from 5 to 200 alternating A,B monolayers. By using such superlattices, it is possible to force misfit dislocations to the edge of the substrate instead of permitting them to propagate up into the growing layer. Such superlattice buffer layers have been characterized previously (Tischler et al., Applied Physics Letters, 46, p. 294 (1985)).

Dislocations due to the different thermal coefficients of expansion are eliminated in the practice of the present invention by in-situ etching of the substrate at or near the growth temperature. The in-situ etching may be effected by the introduction of halogenated gaseous species (i.e. HCl, HF, etc.) which will etchably remove the sacrificial substrate at temperatures close to the growth temperature.

The Ga*N growth process may be performed in a two chamber system with the sacrificial substrate separating the two chambers of the system. By way of example, the two chambers may be separated by a carrier member having holes or openings in it which are the same size as the sacrificial substrate. Small tabs or other retention structures may be used on the bottom of the carrier member to hold the substrate in place. The Ga*N precursors are introduced in one chamber to cause the deposition of the Ga*N layer. The growth of the Ga*N layer proceeds both perpendicular as well as parallel to the substrate surface. After several hundred microns of growth, the Ga*N will extend over the edge of the sacrificial substrate. This overhang may assist in providing a suitable seal between the two chambers. Sealing is further enhanced during the growth process by keeping the pressures in the two chambers substantially equal or slightly lower in the deposition chamber, to minimize diffusion. During or after the growth of the Ga*N layer and without reducing the temperature, the gaseous etching species are introduced in the other chamber to etchably remove the substrate.

Alternatively, an etchant may be chosen which preferentially etches the sacrificial substrate or the Ga*N layer may be grown to a much greater thickness than the thickness of the sacrificial substrate, so that upon etching, the single crystal Ga*N product remains.

In one version of this process, the Ga*N layer is deposited and then the substrate is etchably removed. In another embodiment of this process, Ga*N deposition and substrate removal are performed simultaneously.

As a result, the sacrificial substrate is removed, leaving the Ga*N layer sitting in the recess of the carrier member. During the etching sequence, cross-diffusion may be minimized by keeping the pressure in the growth chamber equal to or slightly higher than the pressure in the etching chamber. Finally, the carrier member may be withdrawn to unload the two-chamber system.

It is apparent from the foregoing that such two-chamber system, or other apparatus system for carrying out the present invention, can be scaled up to grow Ga*N layers on many sacrificial substrates concurrently.

In another embodiment of this process, the growth takes place in a multi-reactor system where first one side of the substrate is exposed to the gas species used for deposition of the desired material. Then the substrate or substrates are transferred to a different chamber where the other side of the substrate is exposed to gas species to etch off the original substrate material.

Depending on the desired goals of the growth process, growth could take place in either the kinetically limited regime or the mass transport limited regime. If growth occurs in a kinetically limited regime, this would permit stacking of the substrates in a furnace for simultaneous uniform Ga*N deposition on a large number of substrates. In another embodiment, growth could take place in the mass transport limited regime, which would maximize the growth rate and lead to short throughput times.

In a specific embodiment, the sacrificial substrate is silicon and the substrate to be produced is GaN. Growth begins by heating the silicon to the growth temperature (in the range of 800°–1300° C.) and introducing the growth precursors for GaN formation. In one preferred method, this growth process involves initial growth of a silicon buffer layer on the silicon substrate to provide a clean nucleation layer for subsequent growth. The supply (flow) of the silicon precursors is then turned off, and the supply (flow) of the GaN precursors is turned on. The GaN layer is grown to the desired thickness (1–1000 μm, preferably 100–300 μm) and the supply (flow) of the GaN precursors is turned off. The etching species is then introduced (for example HCl) and the silicon substrate is etchably removed. Silicon can be etched using HCl over a wide range of temperatures (700°–1200° C.). Typical GaN growth temperatures are about 1000°–1100° C., and so a temperature regime may be selected that is suitable for both growth and etching. The etching time can be reduced by using pre-thinned sacrificial substrates. The remaining GaN layer is then cooled and removed from the reactor.

The growth of GaN layers or films by vapor phase processes is well-known in the art. GaN may be grown using trimethylgallium and ammonia precursors. This process produces high quality material, but the precursors are expensive and the GaN growth is usually done in a cold-wall reactor, which may complicate heating of the substrate during the etching step. Alternatively, GaN may be grown by a chemical vapor transport method, in which gallium and ammonia are the source materials, and a stream of HCl is passed over the gallium to transport it into the reactor in the form of gallium chloride. This method has the advantage that the sources are somewhat more economical and the process is normally carried out in a hot wall reactor.

It will be understood from the foregoing that in addition to GaN, other Ga*N species can be grown in a similar fashion. In fact, Ga*N ternary or quaternary species of precisely specified or of graded composition can be easily produced because the composition is controlled by the gas phase composition during growth. Controlling composition by controlling the ratio of gas phase reactants is much easier than composition control when growth occurs from a liquid melt. Substrates with variations in dopant concentration or in dopant type can also be easily produced. Other materials besides the III–V nitrides could also be grown in this fashion, for example silicon carbide. Some suitable sacrificial substrates for this process include silicon, GaAs and InP.

It is possible that the constituents of the sacrificial substrate may act as a dopant for the desired substrate layer, either by a solid state diffusion process through the interface between the sacrificial substrate and into the Ga*N layer or by "auto-doping," wherein the some amount of the sacrificial substrate material enters the vapor phase at the growth temperature and dopes the Ga*N layer as it is growing. If this latter situation is the case, the back side of the sacrificial substrate could be covered with a suitable mask such as silicon dioxide or silicon nitride to prevent autodoping of the grown layer. However, there may be some diffusion of the sacrificial substrate material into the desired grown layer at the interface. This could be beneficial, as for example in the case of a sacrificial silicon substrate and a grown GaN layer, in which the silicon would form a heavily doped n-type layer at the back of the substrate. Such heavily doped n-type layer would be advantageous for forming n-type ohmic contacts. If this layer were not desired, it could be etched or polished off after the growth process had been completed.

The advantages of the method of the present invention are:

1. Large diameter substrates can be produced. The limit is the available size of the sacrificial substrate. For example if the sacrificial substrate is silicon, this could produce substrates greater than 10 inches in diameter.

2. The substrates are essentially ready for subsequent processing after growth. No orienting, coring, flatting, or sawing are required as in bulk growth. Some minor polishing may be required.

3. Many substrates can be produced simultaneously.

4. No defects from thermal coefficient of expansion differences are produced.

5. The defect density can be further reduced by using buffer layers such as a strained layer superlattice.

6. Heavily doped back contact layers for ohmic contacts may be produced.

7. Substrates of varying compositions can be easily produced. For example ternary substrates with pre-selected stoichiometries can be produced easily because the product composition is controlled by the gas phase composition. Such gas phase ratio control is much easier than composition control when growth occurs from a liquid melt. Substrates with compositional variations can also be easily produced, because the gas phase ratio can be varied during growth.

8. The doping density in the substrates can be easily controlled, again by gas phase composition control. No problems associated with segregation coefficient issues are involved. In addition, the doping in the substrate can be varied, if desired, throughout the thickness of the single crystal Ga*N substrate being prepared.

9. In a potential embodiment, a single crystal Ga*N substrate and a device structure could be grown in one cycle.

The sacrificial substrate epitaxially compatible with the single crystal Ga*N may be any suitable crystalline material, on which Ga*N may be deposited by suitable techniques, such as vapor deposition techniques, including chemical vapor deposition (CVD), chemical vapor transport (CVT), physical vapor deposition (PVD), plasma-assisted CVD, etc. Specific examples include sacrificial substrates of silicon, silicon carbide, gallium arsenide, sapphire, etc., with silicon and silicon carbide being most preferred.

FIG. 1 is a perspective view of a bulk single crystal Ga*N article 10 having a generally cylindrical or disc-shaped form, in which the side face 12 defines a diameter d. A top main surface 16 of this article is in spaced relationship to a corresponding bottom main surface (not shown), to define a thickness z there between, as measured perpendicularly to the plane of the top main surface 16.

This bulk single crystal Ga*N has three dimensional character wherein the diameter is at least 100 micrometers and the z direction is at least 1 μm. In a preferred aspect, the dimensions d is at least 200 μm and z is at least 100 μm. The bulk single crystal Ga*N article may suitably have a thickness dimension z of at least 100 micrometers, and diameter at least 2.5 centimeters.

Such article 10 may be utilized as a substrate for the formation of microelectronic structure(s) thereon, e.g., on the top main surface 16 thereof. Illustrative microelectronic structure(s) include components or assemblies for devices such as LEDs, lasers, transistors, modulation-doped transistors, with applications in full color displays, high density optical storage systems, excitation sources for spectroscopic analysis applications, etc.

Figure 2:
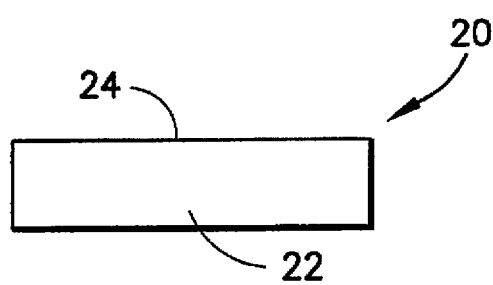
FIG. 2 is a side elevation view of a silicon substrate useful as a supporting base for deposition of single crystal Ga*N thereon.

FIG. 2 is a side elevation view of a silicon substrate 20 comprising a generally disc-like article 22 which is useful as a supporting base for deposition of single crystal Ga*N on a top main surface 24 thereof. The silicon substrate may be of any suitable type as regards its structure and method of formation. It will be recognized that the substrate itself may be of suitable material other than silicon, and in general any appropriate material may be employed which is useful for the deposition of Ga*N thereon. In one embodiment, the silicon substrate 20 may be extremely thin, to minimize the number of defects remaining in the Ga*N grown layer.

On the top surface 24 of the silicon substrate article 22, Ga*N is deposited by any suitable deposition technique, such as those illustratively discussed hereinabove. For example, GaN may be deposited by the hydride or chloride techniques. In another embodiment, GaN may be deposited in a nitrogen atmosphere in a chemical vapor deposition reactor, using a suitable organometallic source reagent for the gallium component of the GaN film or layer to be laid down on top surface 24.

Suitable source reagents for the gallium component of the Ga*N film or layer include gallium and gallium alkyl compounds such as trimethylgallium. In general, the gallium source reagent may comprise any suitable precursor compound or complex which undergoes little decomposition at standard temperature and pressure condition (25° C., one atmosphere pressure) and which is suitably decomposable at elevated temperature to combine with a suitable nitrogen source to form the GaN layer. It is understood by those familiar in the field that this should be done without formation of by-products which may contaminate or otherwise preclude the efficacy or utility of the deposited Ga*N film or layer, or which may impair the efficiency of such film or layer. It is also understood by those experienced in the field that other column III elements may be added or substituted for the Ga precursor. For example In and Al precursors may be used to form Ga*N compounds.

The deposition of the Ga*N layer is performed in a modified system made of conventional crystal growth components as described above.

Figure 3:
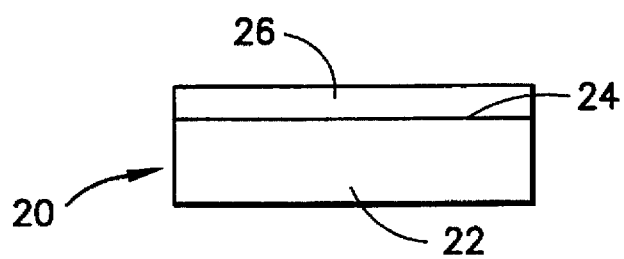
FIG. 3 is a side elevation view of the silicon substrate of FIG. 2, having a layer of single crystal Ga*N deposited thereon.

FIG. 3 is a side elevation view of the silicon substrate 20 of FIG. 2, having a layer of single crystal Ga*N 26 deposited on the top surface 24 of the silicon disc-like article 22 by deposition techniques as described hereinabove.

Figure 4:
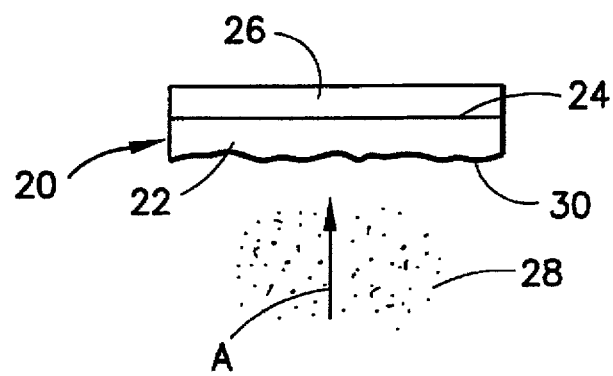
FIG. 4 is a side elevation view of the silicon/Ga*N structure of FIG. 3, showing the etching action of a silicon etchant on the silicon substrate portion of the structure.

FIG. 4 is a side elevation view of the silicon/Ga*N structure of FIG. 3, showing the etching action of a silicon etchant on the silicon substrate portion of the structure. For silicon substrates, hydrogen chloride is a gaseous etchant that is etchingly effective at the Ga*N growth temperature. If the substrate is some material other than silicon, an etchant that is appropriate for that material must be chosen. Hydrogen chloride also may be used to etch gallium arsenide, but silicon carbide and sapphire may require more aggressive etching treatments. Consistent with the process requirements as to purity and low particulate concentrations, the etching process may be assisted by plasma, laser radiation, etc. as may especially be required with the more refractory substrates such as silicon carbide or sapphire.

Figure 5:
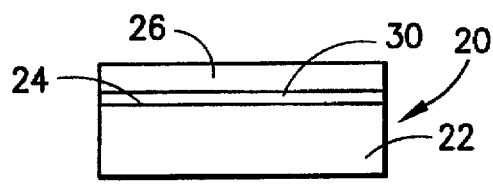
FIG. 5 is a side elevation view of the silicon substrate of FIG. 2, having an intermediate layer of silicon-doped n-type Ga*N thereon, with an upper layer of single crystal Ga*N deposited on the top surface of the intermediate layer of silicon-doped n-type Ga*N.

FIG. 5 is a side elevation view of the silicon substrate of FIG. 2, having an intermediate layer of silicon-doped n-type Ga*N thereon, with an upper layer of single crystal Ga*N deposited on the top surface of the intermediate layer of silicon-doped n-type Ga*N.

The methodology of the present invention may be utilized to form gallium nitride articles of very large size, such as 3 inch diameter wafers or even wafers as large as 18 inches in diameter. Accordingly, the Ga*N layers deposited on such substrates have corresponding dimensions and thus provide substrate bodies of very large size, as suitable for forming a plurality of microelectronic structures on the surface of the Ga*N formed by the process of the present invention.

Figure 6:
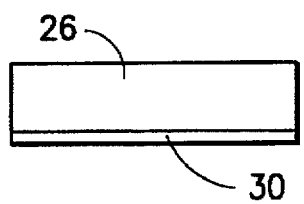
FIG. 6 is a side elevation view of the article of FIG. 5 after removal of the substrate portion thereof, yielding a product article comprising a layer of single crystal Ga*N having associated therewith a bottom surface layer of silicon-doped n-type Ga*N.

FIG. 6 is a side elevation view of the article of FIG. 5 after removal of the substrate portion thereof, yielding a product article comprising a layer of single crystal Ga*N 26 having associated therewith on its bottom surface a layer 30 of silicon-doped n-type Ga*N.

The article shown in FIG. 6 thus comprises a layer of gallium nitride, having a thickness of form example 300 micrometers, with a heavily n-type silicon-doped layer on the bottom. This n-type layer is useful for making low resistance ohmic contacts to n-type Ga*N.

It will be recognized that the description of n-type silicon doped Ga*N on the bottom of the grown Ga*N layer is intended for illustrative purposes only, and in practice the dopant may be of suitable material which is epitaxially compatible with the original base or substrate layer and the Ga*N layer and advantageous in the processing or products structure of the Ga*N articles of the invention.

Alternatively, an interlayer may be employed between the original base and substrate layer and the layer of Ga*N to enhance the crystallinity or other characteristics of the grown Ga*N layer. This so-called buffer layer is commonly used in heteroepitaxial growth to improve crystal quality. For example, in this case it may comprise a grown layer of silicon on the sacrificial silicon substrate, to improve the surface of the substrate before deposition of the Ga*N. The buffer layer may comprise one or more strained layers such as a superlattice. As a still further alternative, the interlayer may comprise a release layer or thin film of a coating or material which assists the removal of the Ga*N layer from the original base or substrate layer. The sacrificial substrate may be of extremely thin thickness, not only to facilitate its subsequent removal by etching, but also to increase the probability that defects generated during Ga*N growth will end up in the sacrificial substrate layer.

Figure 7:
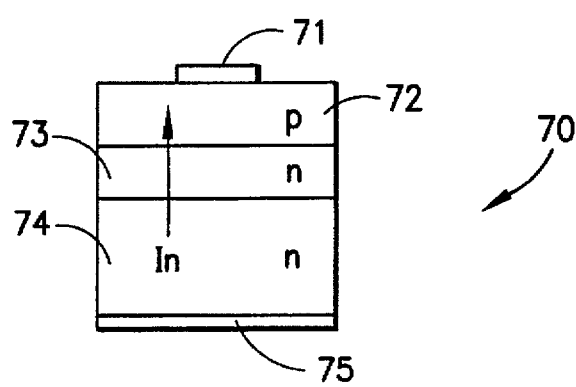
FIG. 7 is a schematic depiction of a light emitting diode device fabricated on a single crystal Ga*N article according to one aspect of the invention.

FIG. 7 is a schematic depiction of a light emitting diode device 70 fabricated on an n-type single crystal GaN substrate 74 according to one aspect of the invention. In this example, on one surface of the substrate 74 an epitaxial n-type GaN layer 73 is grown, followed by a p-type GaN layer 72. An electrical contact 71 is made to the upper p-type GaN layer, and an electrical contact 75 is made to the GaN substrate. The contacts may be formed of any suitable material known in the art, as for example nickel, gold, germanium or indium. Electron current flows in the n to p direction, and light is emitted in the blue to ultraviolet wavelength region as recombination occurs.

Figure 8:
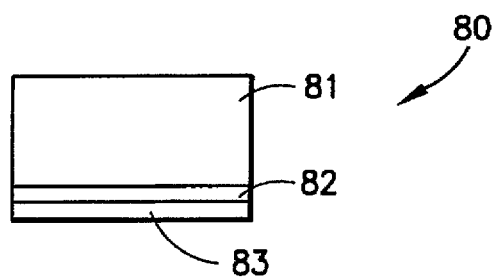
FIG. 8 is a schematic depiction of an ohmic contact structure fabricated on a single crystal Ga*N article according to one aspect of the invention.

FIG. 8 is a schematic depiction of an ohmic contact structure 80 fabricated on a single crystal GaN article 81 according to one aspect of the invention. Silicon-doped GaN layer 82 is formed by diffusion of silicon out of a sacrificial silicon substrate during the growth of the single crystal GaN article, as described above. After the silicon substrate has been etched away, metal layer 83 is deposited on the silicon-doped GaN layer. The metal layer may be formed of any suitable contacting material known in the art, as for example nickel, gold, germanium or indium, which can provide a low-resistance electrical contact to the GaN substrate via the doped layer.

Figure 9A:
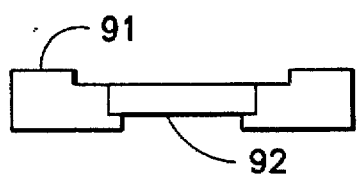
FIG. 9 is a schematic of a wafer carrier suitable for carrying out the process of the present invention, showing (a) the sacrificial substrate at the start of the Ga*N growth, (b) a Ga*N layer grown on the sacrificial substrate, and (c) the Ga*N substrate after removal of the sacrificial substrate.
Figure 9B:
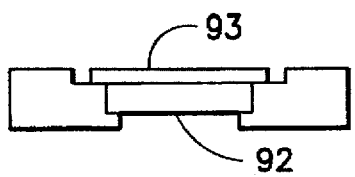
Figure 9C:
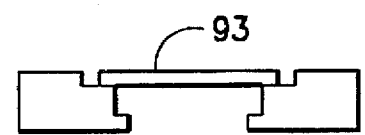

FIG. 9 is a schematic of a wafer carrier 91 suitable for carrying out the process of the present invention, showing (a) the sacrificial substrate 92 at the start of the Ga*N growth, (b) a Ga*N structure 93 grown on the sacrificial substrate, and (c) the Ga*N structure 93 after removal of the sacrificial substrate. Such a wafer carrier could, for example, be used in a two-chambered reactor system where the wafer carrier separates the two chambers. Small tabs on the bottom of the carrier hold the sacrificial substrate in place, as shown in FIG. 9(a). Ga*N growth occurs in the top chamber. Growth proceeds both perpendicularly to as well as parallel to the substrate surface. After several hundred microns of growth, the Ga*N will extend over the edge of the sacrificial substrate, as shown in FIG. 9(b). This overhang helps provide a seal between the two chambers. Sealing is further enhanced during the growth by keeping the pressures in the two chambers approximately equal or slightly lower in the deposition chamber to minimize diffusion. Without allowing the temperature to vary more than 100° C., and preferably less than 25° C., the etchant species is introduced into the lower chamber. The sacrificial substrate is etched away, leaving the Ga*N layer sitting in the recess of the carrier as shown in FIG. 9(c). During the etching sequence, cross-diffusion is minimized by keeping the pressure in the upper chamber equal to or slightly higher than in the lower chamber. Upon completion of etching and cool down, the carrier can then be withdrawn from the reactor to unload the system. It is clear that this type of system can be scaled up to process many sacrificial substrates simultaneously.

As mentioned above, the Ga*N bulk crystal material of the invention contemplates binary as well as ternary and quaternary III–V nitride compounds, silicon carbide, and all possible crystal forms, including all cubic, hexagonal and rhombohedral modifications and all SiC polytypes within the scope hereof. Compositionally graded ternary and quaternary compounds such as AlGaN or AlGaInN are also envisioned, as are Ga*N materials in which the dopant concentration is varied.

While the invention has been described with regard to specific embodiments, structure and features, it will be recognized that the invention may be modified or otherwise adapted to a specific end use application, and all variations, modifications, and embodiments of the invention as claimed are to be regarded as being within the spirit and scope of the invention.

What is claimed is:

1. A method of making a single crystal Ga*N article, including the steps of:
   providing a sacrificial base of crystalline material different from, and having a surface which is epitaxially compatible with, Ga*N;
   depositing a layer of single crystal Ga*N over a surface of the sacrificial base substrate; and
   etching away the sacrificial base from the layer of single crystal Ga*N while the crystal is close to the growth temperature, to recover the layer of single crystal Ga*N as a single crystal Ga*N article from which the sacrificial base has been removed.

2. A method according to claim 1, wherein the sacrificial base of crystalline material is formed of a material selected from the group consisting of silicon, silicon carbide, gallium arsenide, and sapphire.

3. A method according to claim 1, wherein the sacrificial base of crystalline material is formed of a material selected from the group consisting of silicon, silicon carbide, and gallium arsenide, and the substrate is etched away from the layer of single crystal Ga*N at or near the growth temperature, by etching away of the sacrificial base using a gas which etches away the sacrificial base material but does not etch the single crystal Ga*N material.

4. A method according to claim 1, wherein the sacrificial base of crystalline material is formed of a material selected from the group consisting of silicon, silicon carbide, and gallium arsenide, and carbide, and gallium arsenide, and the sacrificial base is etched away from the layer of single crystal Ga*N at or near the growth temperature, by etching away of the sacrificial base using a gas which etches away the sacrificial base material at a more rapid rate than it etches the single crystal Ga*N material.

5. A method according to claim 1, wherein the layer of single crystal Ga*N is deposited directly on said surface of the crystalline sacrificial base.

6. A method according to claim 1, wherein an intermediate layer of epitaxially related crystalline material is deposited directly on said surface of the crystalline sacrificial base, and the layer of single crystal Ga*N is deposited directly on an upper surface of the intermediate layer.

7. A method according to claim 6, wherein the sacrificial base crystalline material comprises silicon, the intermediate layer of epitaxially related crystalline material comprises silicon, and the layer of single crystal Ga*N comprises a GaN layer.

8. A method according to claim 6, wherein the intermediate layer of epitaxially related crystalline material comprises a strained layer superlattice.

9. A method according to claim 8, wherein the strained superlattice comprises from 5 to 100 alternating monolayers of two materials selected from the group consisting of AlN, InN, GaN and alloys of SiC with one or more of AlN, InN, and GaN.

10. A method according to claim 1 wherein the sacrificial base crystalline material or a component of the sacrificial base crystalline material is diffused out of the sacrificial base into the Ga*N layer, for incorporation of the sacrificial base crystalline material or a component thereof in the Ga*N layer as a dopant thereof.

11. A method according to claim 10, wherein the sacrificial base crystalline material comprises silicon and wherein the silicon sacrificial base is etched away with HCl gas to yield the Ga*N layer having a silicon-doped Ga*N surface region for formation of ohmic contacts thereon.

12. A method according to claim 1, wherein the layer of single crystal Ga*N comprises a GaN layer.

13. A method according to claim 1, wherein the layer of single crystal Ga*N comprises an MGaN layer, wherein M is a metal compatible with Ga and N in the composition MGaN, and the composition MGaN is stable at standard temperature and pressure (25° C. and 1 atmosphere pressure) conditions.

14. A method according to claim 13, wherein M is selected from the group consists of Al and In.

15. A method according to claim 1 where Ga*N is selected from the group consisting of SiC and alloys of SiC with one or more of AlN, GaN and InN.

16. A method according to claim 1 where the thickness of the sacrificial base is less than the thickness of the single crystal Ga*N layer.

17. A method according to claim 1, where the single crystal Ga*N layer comprises a compositionally graded ternary metal nitride selected from the group consisting of AlGaN, InGaN, and AlInN.

18. A method according to claim 1, where the single crystal Ga*N layer comprises varying dopant concentration.

* * * * *

UNITED STATES PATENT AND TRADEMARK OFFICE
CERTIFICATE OF CORRECTION

PATENT NO. : 5,679,152
DATED : October 21, 197
INVENTOR(S) : Michael A. Tischler et al.

It is certified that error appears in the above-indentified patent and that said Letters Patent is hereby corrected as shown below:

| | |
|---|---|
| Column 1, Line 50 | change "AI" to -- Al -- |
| Column 1, Line 52 | change "0to 1" to -- 0 to 1 -- |
| Column 1, Line 65 | change "AIN, InN, AIGaN" to -- AlN, InN, AlGaN -- |
| Column 2, Line 8 | change "AIGaN" to -- AlGaN -- |
| Column 3, Line 56 | move "EMBODIMENTS THEREOF" to line 55 and center beneath "INVENTION, AND PREFERRED" |
| Column 4, Line 41 | change "AIN" to -- AlN -- |
| Column 10, Line 28 | delete "substrate" |

Signed and Sealed this

Twenty-seventh Day of January, 1998

*Attest:*

BRUCE LEHMAN

*Attesting Officer*   Commissioner of Patents and Trademarks